United States Patent
Conte et al.

(10) Patent No.: US 9,679,618 B2
(45) Date of Patent: Jun. 13, 2017

(54) SENSE STRUCTURE BASED ON MULTIPLE SENSE AMPLIFIERS WITH LOCAL REGULATION OF A BIASING VOLTAGE

(71) Applicant: STMICROELECTRONICS S.r.l., Agrate Brianza (IT)

(72) Inventors: Antonino Conte, Tremestieri Etneo (IT); Mario Micciche', Agrigento (IT); SantiNunzioAntonino Pagano, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/703,173

(22) Filed: May 4, 2015

(65) Prior Publication Data
US 2015/0332739 A1 Nov. 19, 2015

(30) Foreign Application Priority Data
May 13, 2014 (IT) .............................. MI2014A0864

(51) Int. Cl.
*G11C 7/06* (2006.01)
*G11C 7/10* (2006.01)
*G11C 7/12* (2006.01)
*G11C 16/24* (2006.01)
*G11C 16/28* (2006.01)

(52) U.S. Cl.
CPC ............ *G11C 7/062* (2013.01); *G11C 7/1051* (2013.01); *G11C 7/12* (2013.01); *G11C 16/24* (2013.01); *G11C 16/28* (2013.01); *G11C 2207/002* (2013.01)

(58) Field of Classification Search
CPC ......... G11C 7/06; G11C 7/062; G11C 7/1051; G11C 16/26; G11C 16/28
USPC ...................................................... 365/189.07
See application file for complete search history.

(56) References Cited

U.S. PATENT DOCUMENTS

| 7,477,559 | B2 * | 1/2009 | Taddeo ..................... G11C 7/02 365/191 |
| 2011/0090745 | A1 * | 4/2011 | La Rosa .................. G11C 7/12 365/189.09 |

* cited by examiner

*Primary Examiner* — Tha-O H Bui
*Assistant Examiner* — Alfredo Bermudez Lozada
(74) *Attorney, Agent, or Firm* — Slater Matsil, LLP

(57) ABSTRACT

A sense structure may include sense amplifiers each having measuring and reference terminals for receiving a measuring and a reference current, respectively, output circuitry for providing an output voltage based upon the measuring and reference currents, and voltage regulating circuitry in cascode configuration for regulating a voltage at the measuring and reference terminals. The regulating circuitry may include measuring and regulating transistors and a reference regulating transistor having a first conduction terminal coupled with the measuring terminal and with the reference terminal, respectively, a second conduction terminal coupled with the output circuitry and a control terminal coupled with a biasing terminal. Biasing circuitry is for providing a biasing voltage to the biasing terminal, and common regulating circuitry is for regulating the biasing voltage. Each sense amplifier may also include local regulating circuitry for regulating the biasing voltage applied to the biasing terminal.

13 Claims, 6 Drawing Sheets

SENSE STRUCTURE BASED ON MULTIPLE SENSE AMPLIFIERS WITH LOCAL REGULATION OF A BIASING VOLTAGE

TECHNICAL FIELD

The present disclosure relates to the field of electronics. More specifically, this disclosure relates to sense amplifiers.

BACKGROUND

Sense amplifiers are commonly used to compare a measuring current at low value provided by a load (for example, on the order of a few µA) with a reference current. For example, several memory devices (and especially non-volatile memory devices) are provided with sense amplifiers for reading logic values stored in selected memory cells. Typically, each memory device simultaneously reads a word formed by the logic values stored in a selected page of memory cells (for example, 64-256). Therefore, the memory device includes a sense structure formed by a corresponding number of sense amplifiers (each one for reading a corresponding memory cell of the selected page).

The operation of the sense amplifiers typically requires that its terminals receiving the measuring current and the reference current should be kept at a predetermined sensing voltage. For example, in non-volatile memory devices (wherein the logic values stored in the memory cells are typically represented by a threshold voltage of its floating gate MOS transistors), the sensing voltage is used to bias the selected memory cells for reading (so that their MOS transistors are conductive or non-conductive according to the stored logic value).

An accurate control of the sensing voltage is desirable in many applications of the sense amplifiers. For example, in non-volatile memory devices the sensing voltage should be maintained at a value such as to enable the correct discrimination of the logic values stored in the selected memory cells, but without any alteration thereof. This may be particularly important when the sensing voltage has relatively low value (for example, <1-2 V).

For this purpose, the sense amplifiers are usually equipped with a voltage regulator (for regulating the sensing voltage to limit possible variations with respect to its desired value). A typical implementation of such voltage regulator is with transistors (for example, of the MOS type) in cascode configuration. This structure allows pre-loading of the terminals of the sense amplifiers (to the sensing voltage) in a relatively fast way, even when they are connected to a load with high capacitance (for example, a column of memory cells in the non-volatile memory devices). Particularly, in a cascode configuration with fixed control (for example, of the gate type), the sensing voltage is regulated by controlling the transistors of the voltage regulator by a biasing voltage of constant value (provided by a biasing stage being common to all the sense amplifiers).

However, the measuring current may cause noise (variable with their value) on the biasing voltage. In addition, the different sense amplifiers may affect each other (according to the different values of their measuring currents). Therefore, the biasing voltage is normally regulated, for example, by a regulating capacitor being common to all the sense amplifiers that filters the noise caused by them (thereby limiting its effects). Such regulating capacitor has a relatively high capacitance, which increases with the number of sense amplifiers (for example, on the order of 50-150 pF). This involves a considerable waste of area (for example, in a chip of semiconductor material on which the non-volatile memory device is integrated).

SUMMARY

A summary of the present disclosure is herein presented in order to provide a basic understanding thereof. However, the purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of regulating the biasing voltage locally. Particularly, an aspect provides a sense structure that includes a plurality of sense amplifiers (each one comprising voltage regulating means in cascode configuration), wherein each sense amplifier further comprises local regulating means or circuitry (for regulating a biasing voltage applied to the corresponding voltage regulating means) that is coupled/decoupled selectively with common regulating means or circuitry of the sense structure.

In particular, a sense structure may include a plurality of sense amplifiers. Each sense amplifier includes at least one measuring terminal and a reference terminal configured to receive a measuring current and a reference current, respectively, and output circuitry configured to provide an output voltage based upon a comparison between the measuring current and the reference current. Each sense amplifier also includes a biasing terminal and voltage regulating circuitry in cascode configuration and configured to regulate a voltage at the measuring terminal and at the reference terminal. The voltage regulating circuitry includes a measuring regulating transistor and a reference regulating transistor having a first conduction terminal coupled with the measuring terminal and with the reference terminal, respectively, a second conduction terminal coupled with the output means or circuitry and a control terminal coupled with a biasing terminal. The sense structure further includes biasing circuitry configured to provide a biasing voltage to the biasing terminal of the plurality of sense amplifiers, and common regulating circuitry configured to regulate the biasing voltage for the plurality of sense amplifiers.

Each sense amplifier further includes local regulating circuitry configured to regulate the biasing voltage applied to the biasing terminal, and the sense structure further includes switching circuitry selectively controllable and configured to couple the local regulating circuitry of each of the plurality of sense amplifiers to the common regulating circuitry to refresh the local regulating circuitry in a rest condition and to decouple the local regulating circuitry of each of the plurality of sense amplifiers from the common regulating circuitry in an operative condition.

The biasing circuitry includes an output terminal, and the common regulating circuitry includes a common capacitor coupled between the output terminal and configured to provide the biasing voltage and a ground terminal configured to receive a ground voltage. In each sense amplifier the local regulating circuitry comprises a local capacitor coupled between the biasing terminal and the ground terminal.

The switching circuitry comprises a switch for each sense amplifier. The switch is coupled between the output terminal of the biasing circuitry and the biasing terminal.

Each sense amplifier includes further switching circuitry configured to selectively couple the reference terminal to the measuring terminal during a pre-charging phase of the measuring terminal. Each sense amplifier comprises current providing circuitry configured to provide an internal current, summing circuitry configured to sum the measuring current and the internal current to define a sum current, mirroring circuitry configured to mirror the sum current, subtraction circuitry configured to subtract the reference current from the mirrored sum current to define a difference current, and output circuitry configured to provide the output voltage based upon a comparison between the difference current and the internal current.

The output circuitry has a measuring node and a reference node coupled with the second conduction terminal of the measuring regulating transistor and of the reference regulating transistor, respectively. The output circuitry includes a first internal measuring transistor and a first internal reference transistor having a first conduction terminal coupled to the measuring node and to the reference node, respectively, and a control terminal coupled with a first internal biasing terminal for receiving a first internal biasing voltage configured to bias the first internal measuring transistor and the first internal reference transistor to conduct the internal current. The output circuitry may also include a second internal measuring transistor and a second internal reference transistor having a first conduction terminal coupled to a ground terminal, a second conduction terminal coupled to a second conduction terminal of the first internal measuring transistor and of the first internal reference transistor, respectively, and a control terminal coupled to a second internal biasing terminal for receiving a second internal biasing voltage configured to bias the second internal measuring transistor and the second internal reference transistor to conduct the internal current.

The output circuitry may also include a measuring conversion transistor and a reference conversion transistor having a first conduction terminal coupled to a power supply terminal for receiving a supply voltage, a second conduction terminal coupled to the measuring node and to the reference node, respectively, and a control terminal coupled with the second conduction terminal of the first internal measuring transistor.

A further aspect provides a non-volatile memory device comprising such sense structure. A further aspect provides a corresponding sensing method.

In particular, a sensing method includes receiving at least one measuring current and a reference current at a measuring terminal and at a reference terminal, respectively, of each one of a plurality of sense amplifiers of a sense structure. The method includes regulating a biasing voltage for the plurality of sense amplifiers by common regulating circuitry and providing the biasing voltage to the biasing terminal of the plurality of sense amplifiers. The method also includes regulating a voltage at the measuring terminal and at the reference terminal of each of the plurality of sense amplifiers by voltage regulating circuitry in cascode configuration comprising a measuring regulating transistor and a reference regulating transistor having a first conduction terminal coupled to the measuring terminal and to the reference terminal, respectively, a second conduction terminal coupled with output circuitry of the sense amplifier and a control terminal coupled with a biasing terminal. The method also includes providing an output voltage according to a comparison between the measuring current and the reference current by output circuitry of each of the plurality of sense amplifiers.

The method further includes regulating the biasing voltage at the biasing terminal of each of the plurality of sense amplifiers by local regulating circuitry, and selectively controlling switching circuitry to couple the local regulating circuitry of each of the plurality of sense amplifiers to the common regulating circuitry to refresh the local regulating circuitry in a rest condition and to decouple the local regulating circuitry of each of the plurality of sense amplifiers from the common regulating circuitry in an operative condition.

DETAILED DESCRIPTION

Figure 1:
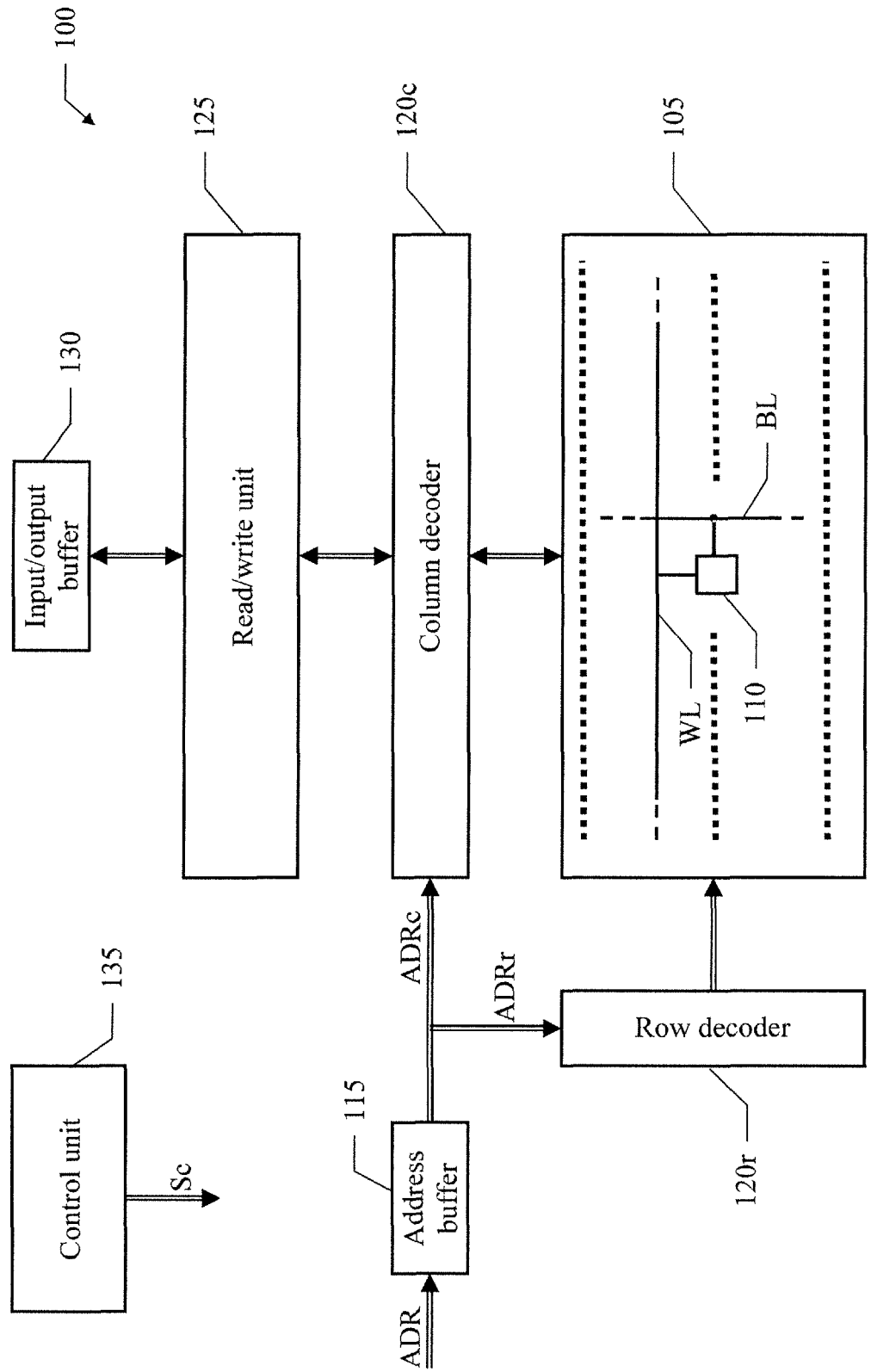
FIG. 1 is a schematic block diagram of a memory device in which a sense structure according to an embodiment of the present invention may be applied.

With reference in particular to FIG. 1, a principle block diagram is shown of a memory device 100 in which the approach according to an embodiment of the present disclosure may be applied. For example, the memory device 100 is a non-volatile memory device being embedded (eNVM) in an electronic system, not shown in the figure (for example, a low power micro-controller or security apparatus).

The memory device 100 comprises a memory array 105, which is formed by a plurality of memory cells 110 (for example, based on floating-gate MOS transistors) organized in rows and columns (for example, 128-512 rows and 512-1024 columns). The memory cells of each row are coupled with a same word line WL, whereas the memory cells of each column are coupled with a same bit line BL. Each memory cell 110 may have different states each of which represents a logic value (for example, a bit) stored therein (for example, defined by a threshold voltage of its MOS transistor). The memory device 100 processes (i.e., reads and writes) more bits simultaneously at the level of words (for example, each one consisting of N=64 bits), which are stored in a corresponding page of memory cells 110 of a same row.

An address buffer 115 receives an address ADR of a selected word (to be read from or to be written into a selected page). The address buffer 115 extracts a row address ADRr and a column address ADRc from the address ADR. The row address ADRr is supplied to a row decoder 120r that selects the word line WL of the selected page. The column address ADRc is supplied to a column decoder 120c that selects, within each packet of bit lines BL associated to an i-th position (with i=1 . . . N) in all the pages, the bit line BL of the selected page.

A read/write unit 125 comprises all the components that are used to read and to write the memory cells 110. In particular, as far the context of the present disclosure is concerned, the read/write unit 125 comprises a sense structure for reading a word from a selected page. For this purpose, the read/write unit 125 is coupled with the column decoder 120c. Moreover, the read/write unit 125 is coupled with an input/output (I/O) buffer 130, which receives a word to be written into the selected page or a word read from the selected page. A control unit 135 (for example, implemented by a state machine) controls operation of the entire memory device 100 (by corresponding control signals, indicated as a whole with the reference Sc).

Figure 2:
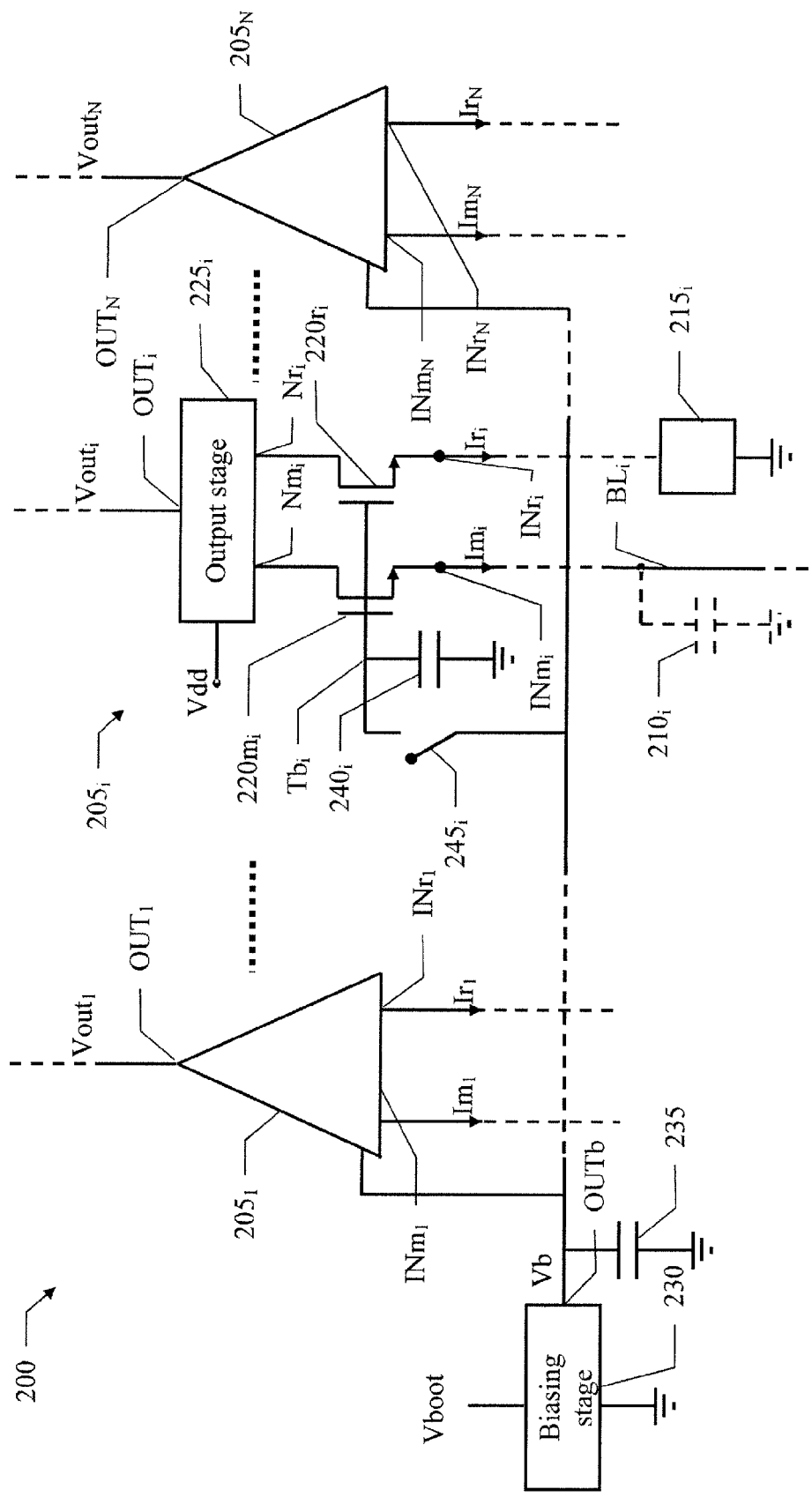
FIG. 2 is a schematic block diagram of a sense structure according to an embodiment of the present invention.

FIG. 2 illustrates a sense structure 200 according to an embodiment of the present disclosure. The sense structure 200 comprises a sense amplifier $205_i$ for each i-th packet of bit lines. The sense amplifier $205_i$ has two input terminals, and in particular a measuring terminal $INm_i$ and a reference terminal $INr_i$. During each reading operation, the measuring terminal $INm_i$, is coupled (via the column decoder, not shown in the figure) with the (selected) bit line, denoted with the reference $BL_i$, of the selected page within the corresponding packet of bit lines. The memory cells connected to the selected bit line $BL_i$, are biased to a reading voltage (for example, 1-2V) so that the (selected) memory cell of the selected word conducts a reading current corresponding to its threshold voltage (for example, of low value or high value when the selected memory cell stores the logic value 0 or the logic value 1, respectively), and so that the other memory cells do not conduct any current. Accordingly, the selected bit line $BL_i$ conducts a measuring current $Im_i$ substantially equal to the reading current of the selected memory cell, which measuring current $Im_i$ is then supplied to the measuring terminal $INm_i$. A capacitor $210_i$ (in dashed lines between the measuring terminal $INm_i$ and a reference voltage, or ground, terminal) represents a stray capacitance of the memory cells connected to the selected bit line $BL_i$. The reference terminal $INr_i$ is instead coupled (via a corresponding switch, not shown in the figure) with a reference cell $215_i$, (referred to ground). During each reading operation, the reference cell $215_i$, is biased to the same reading voltage. The reference cell $215_i$ is configured to conduct a reference current $Ir_i$ having an intermediate value between the low value and the high value of the reading current, which reference current In is then supplied to the reference terminal INri.

The sense amplifier 205i comprises a voltage regulator stage in (fixed gate) cascode configuration, which is used to pre-charge the measuring terminal $INm_i$ and the reference terminal $INr_i$ to the reading voltage and to regulate it. The voltage regulator stage comprises a (measuring regulating) MOS transistor $220m_i$ of N-type and a (reference regulating) MOS transistor $220r_i$ of N-type. The transistor $220m_i$ and the transistor $220m_i$ have a source terminal that is coupled with the measuring terminal $INm_i$ and with the reference terminal $INr_i$, respectively, and a gate terminal that is coupled with a biasing terminal $Tb_i$. Moreover, the transistor $220m_i$ and the transistor $220r$, have a drain terminal that is coupled with a measuring node $Nm_i$ and with a reference node $Nr_i$, respectively, of an output stage $225_i$. The output stage $225_i$ is supplied by a supply voltage Vdd of the electronic device (for example, 1.5-2V). The output stage $225_i$ has another node that defines an output terminal $OUT_i$ of the sense amplifier $205_i$, which provides an output voltage $Vout_i$ according to a comparison between the measuring current $Im_i$ and the reference current $Ir_i$ (for example, at a low value or at a high value when the measuring current $Im_i$ is higher or lower, respectively, than the reference current $Ir_i$). The output voltage $Vout_i$ represents the bit stored in the selected memory cell (for example, the logic value 0 or the logic value 1 when the output voltage $Vout_i$ has the high value or the low value, respectively), which is loaded into the input/output buffer (not shown in the figure).

The sense structure 200 comprises a biasing stage 230, which is supplied between the ground voltage and a bootstrap voltage Vboot generated within the electronic device (for example, by a charge pump, not shown in the figure) so as to have an absolute value higher than the supply voltage Vdd (for example, 4-7 V). The biasing stage 230 has an output terminal OUTb that provides a biasing voltage Vb at a constant value (for example, 3-4 V). The output terminal OUTb is coupled with the biasing terminals $Tb_i$ of all the sense amplifiers $205_i$ (so as to provide the biasing voltage Vb to the gate terminals of the corresponding transistors $220m_i$, $220r_i$). A common (regulating) capacitor 235 is coupled between the output terminal OUTb and the ground terminal for regulating the biasing voltage Vb by filtering a noise caused by the measuring currents $Im_i$ (typically increasing with their value).

In the approach according to an embodiment of the present disclosure, a local (regulating) capacitor $240_i$ is provided for each sense amplifier $205_i$. The local capacitor $240_i$ is coupled between the biasing terminal $Tb_i$ and the ground terminal. Moreover, a switch $245_i$ is coupled between the biasing terminal $Tb_i$ and the output terminal OUTb (so as to be interposed between the sense amplifier $205_i$ and the biasing stage 230). As described in detail in the following, in a rest condition the switch $245_i$ is closed so that the local capacitor $240_i$ is coupled with the common capacitor 235 in order to be refreshed by the latter. On the contrary, in an operative condition the switch $245_i$ is open so that the local capacitor $240_i$ is decoupled from the common capacitor 235.

In this way, in the operating condition the biasing voltage Vb is supplied to each sense amplifier $205_i$ from the corresponding local capacitor $240_i$. Therefore, this local capacitor 240i may have very limited values of its capacitance (for example, 0.1-0.2 pF), since it only has to filter the noise induced by the corresponding measuring current $Im_i$. At the same time, the common capacitor 235 is insulated from the sense amplifiers $205_i$. Therefore, the common capacitor 235 is not affected by the noise caused by the sense amplifiers $205_i$ and then it may have very limited capacitance compared to the structures known in the art (for example, 5-10 pF). Overall, the total capacitance (of the common capacitor 235 and all the local capacitors 240i) is reduced. This involves a corresponding saving of area (for example, in a chip of semiconductor material on which the non-volatile memory device is integrated).

Figure 3:
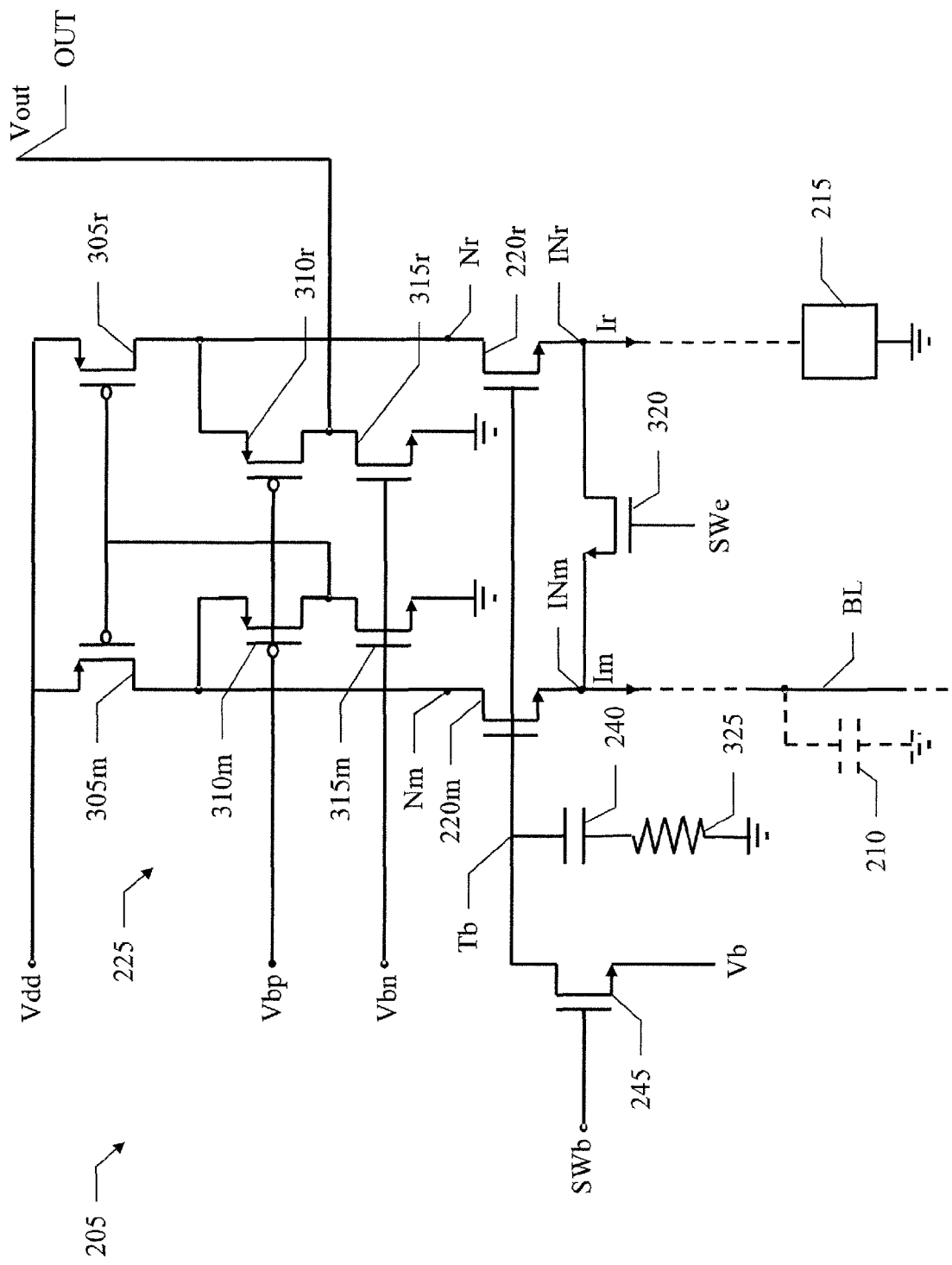
FIG. 3 shows a simplified schematic circuit diagram of a sense amplifier according to an embodiment of the present disclosure.

With reference now to FIG. 3, a simplified schematic circuit diagram is shown of a sense amplifier according to an embodiment of the present disclosure (denoted as a whole and in its components with the corresponding references without any index). Particularly, the output stage 225 comprises a (measuring conversion) MOS transistor 305m of P-type and a (reference conversion) MOS transistor 305r of P-type. The transistor 305m and the transistor 305r have a drain terminal (which defines the measuring node Nm and the reference node Nr, respectively) coupled with the drain terminal of the transistor 220m and of the transistor 220r, respectively. Moreover, the transistor 305m and the transistor 305r have a source terminal coupled with a power supply line which receives the supply voltage Vdd, and a gate terminal in common. The output stage 225 further comprises a (first internal measuring) MOS transistor 310m of P-type, a (first internal reference) MOS transistor 310r of P-type, a (second internal measuring) MOS transistor 315m of N-type and a (second internal reference) MOS transistor 315r of N-type. The transistor 310m and the transistor 310r have a source terminal coupled with the drain terminal of the transistor 305m and of the transistor 305r, respectively, and a drain terminal coupled with a drain terminal of the transistor 315m and of the transistor 315r, respectively. Moreover, the transistor 310m and the transistor 310r have a gate terminal in common that receives a (first internal) biasing voltage Vbp, which is provided by the biasing stage (not shown in the figure). The drain terminals of the transistors 310m, 315m are coupled with the gate terminal of the transistor 305m, while the drain terminals of the transistors 310r, 315r define the output node OUT (which provides the output voltage Vout). In turn, the transistor 315m and the transistor 315r have a source terminal coupled with the ground terminal, and a gate terminal in common which receives a (second internal) biasing voltage Vbn, which it is supplied by the biasing stage as well. In this way, the transistors 220m, 305m and the transients 220r, 305r are connected in series between them in cascode configuration (with the transistors 220m, 220r at common source and the transistors 305m, 305r at common gate). Moreover, the transistors 220m, 305m, 310m, 315m, and the transistors 220r, 305r, 310r, 315r form a measuring branch and a reference branch, respectively, which are coupled together in current mirror configuration.

The sense amplifier 205 further comprises an (equalization) MOS transistor 320 of N-type. The transistor 320 has a source terminal coupled with the measuring terminal INm (which receives the measuring current Im), and a drain terminal coupled with the reference terminal INr (which receives the reference current Ir). Moreover, the transistor 320 has a gate terminal that receives a control signal SWe (provided by the control unit, not shown in the figure). In this case, a resistor 325 is coupled in series with the local capacitor 240 (between the biasing terminal Tb and the ground terminal). Furthermore, the switch between the biasing terminal Tb and the biasing stage (for receiving the biasing voltage Vb) is implemented by another (switching) MOS transistor of N-type, indicated with the same reference 245. The transistor 245 has a source terminal that receives the biasing voltage Vb and a drain terminal coupled with the biasing terminal Tb. Moreover, the transistor 245 has a gate terminal that receives a control signal SWb (provided by the control unit as well).

Figure 4A:
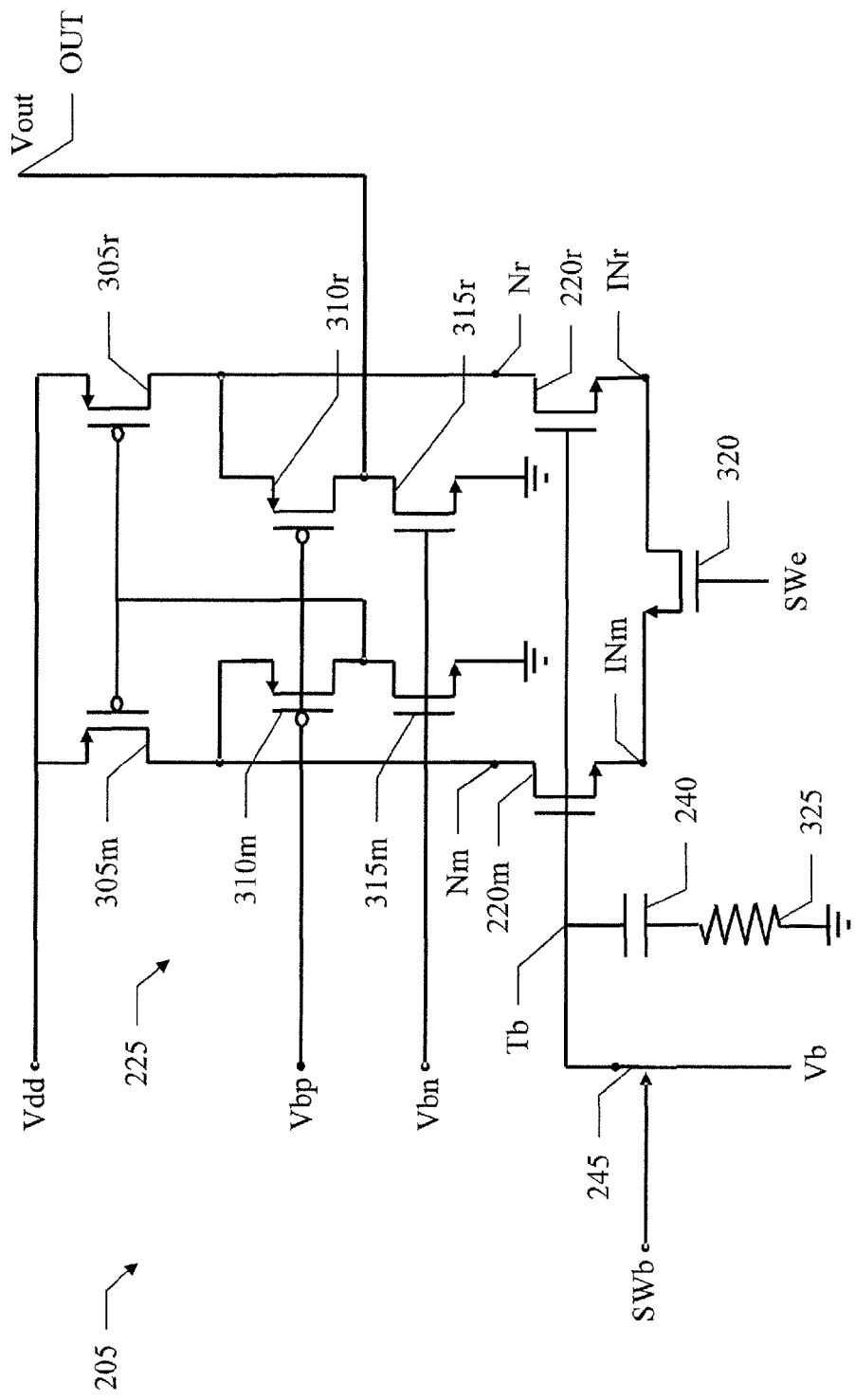
FIGS. 4A-4C are schematic circuit diagrams showing different operative conditions of a sense amplifier according to an embodiment of the present invention.
Figure 4B:
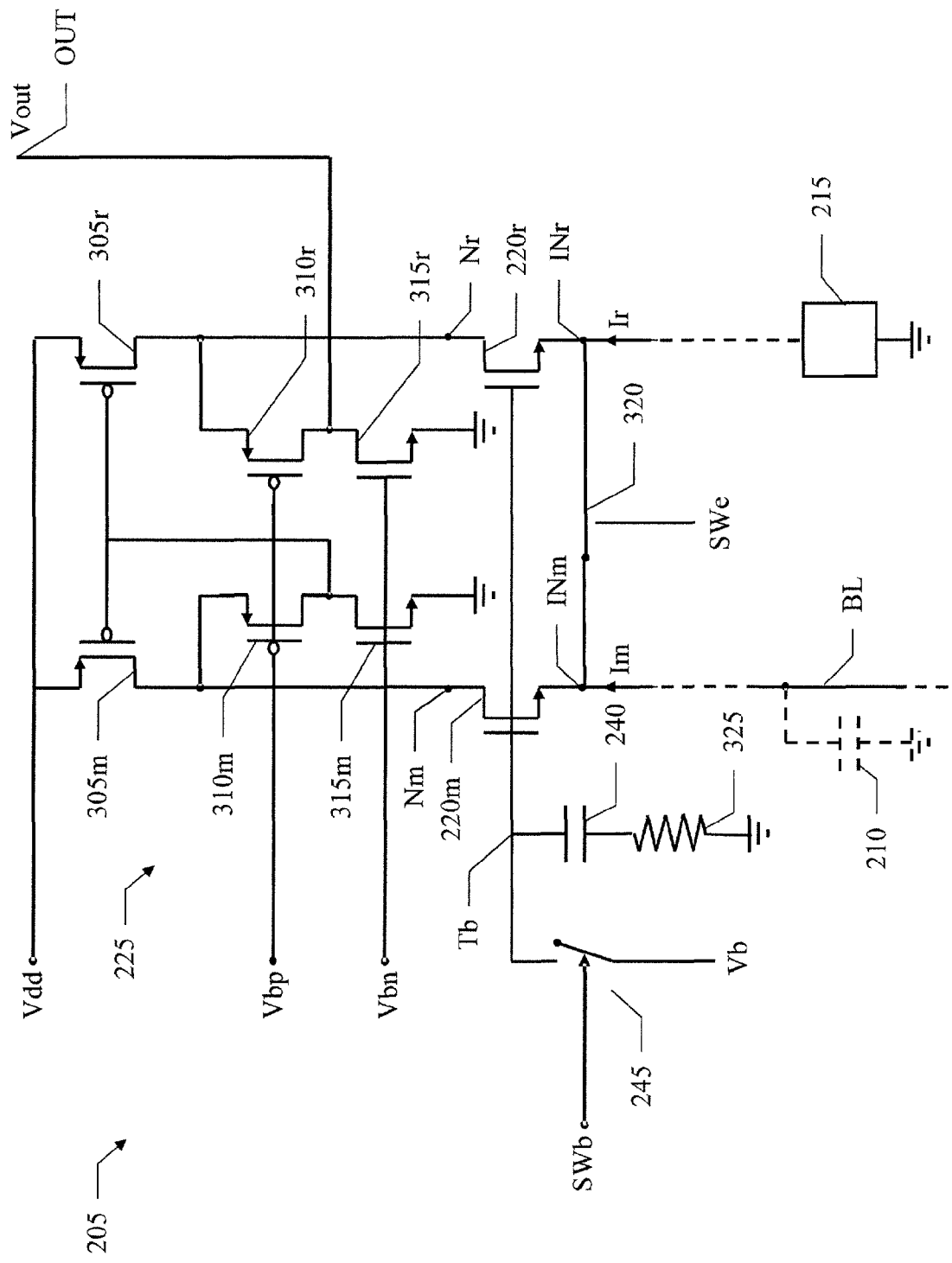
Figure 4C:
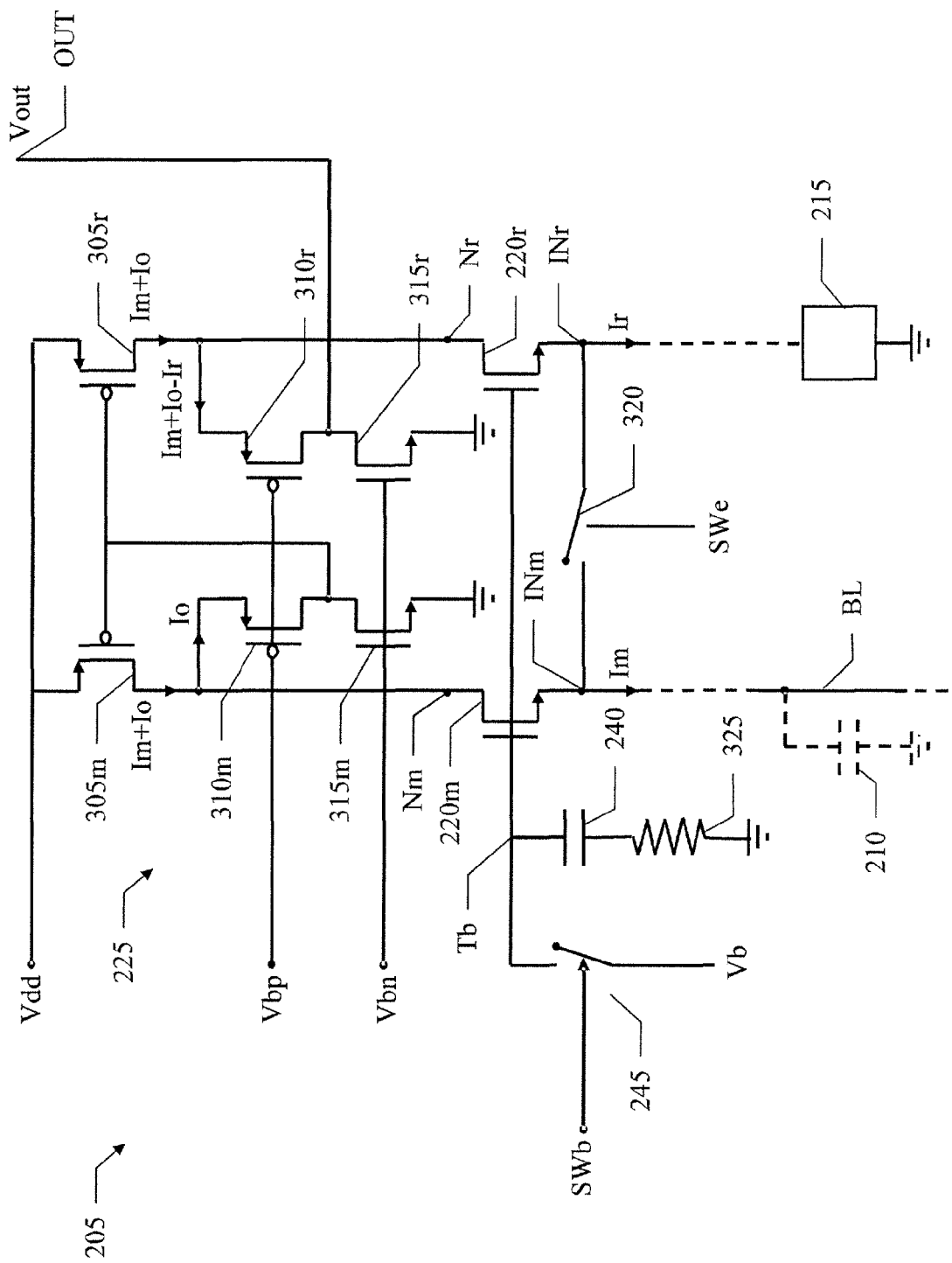

With reference now to FIGS. 4A-4C, different operative conditions of such sense amplifier 205 according to an embodiment of the present disclosure are illustrated. Starting from FIG. 4A, in a rest condition the measuring terminal INm and the reference terminal INr are insulated from the memory cells and from the reference cell (not shown in the figure), and they are thus floating. At the same time, the control signal SWe, the biasing voltage VBp and the biasing voltage Vbn are maintained at a low value (for example, 0V). In this condition, all the transistors 220m, 220r, 305m, 305r, 310m, 310r, 315m, 315r and 320 are off. The control signal SWb has a rather high value (for example, 1V), so that the transistor 245 is turned on to define a short-circuit. Therefore, the capacitor 240 is loaded to the local biasing voltage Vb by the common capacitor (not shown in the figure).

Passing to FIG. 4B, during a reading operation the measuring terminal INm is coupled with the selected bit line BL and the reference terminal INr is coupled with the reference cell 215. The reading operation begins with a pre-charging phase of the measuring terminal INm and of the reference terminal INr. For this purpose, the biasing voltage Vbp and the biasing voltage Vbn are maintained at a low value, so that the transistors 310m, 310r, 315r and 315m are still off. The control signal SWb is now brought to the low value, so that the transistor 245 as well is turned off to define an open circuit. At the same time, the control signal SWe is brought to the high value, so that the transistor 320 is turned on to define a short-circuit.

In this condition, the measuring node INm and the reference node INr are brought towards the reading voltage across the transistors 220m, 305m and across the transistors 220r, 305r, respectively (in cascode configuration), with the reading voltage that is defined by the biasing voltage Vb supplied to the gate terminals of the transistors 220m, 220r by the local capacitor 240. Such pre-charging has negligible length for the reference terminal INr, since an equivalent capacitance of the (single) reference cell 215 is very low. The pre-charging of the measuring terminal INm instead has higher length, because of the relatively high stray capacitance (represented by the capacitor 210) of the memory cells connected to the selected bit line BL.

However, in the approach according to an embodiment of the present disclosure, the transistors 220r, 305r are now used as well (through the transistor 320) to pre-charge the measuring terminal INm. Moreover, the noise caused on the capacitor 240 as well contributes to pre-charge the measuring terminal INm (with a corresponding over-voltage that is controlled by the resistor 325).

Consequently, the time required to pre-charge the measuring terminal INm is substantially reduced (for example, down to 2-6 ns). At the same time, the local capacitor 240 is insulated from the common capacitor (not shown in the figure), so that the noise caused on the local capacitor 240 does not affect the common capacitor.

Passing to FIG. 4C, the reading operation continues with an actual sensing phase of the logic value stored in the selected memory cell (according to a comparison between the measuring current Im and the reference current Ir). For this purpose, the biasing voltage Vbp and the biasing voltage Vbn are brought to a value (for example, 0.2-0.5 V) such as to turn on the transistors 310m, 315m and the transistors 310r, 315r, respectively, so that they conduct an internal current In of pre-defined value (for example, on the order of the reference current Ir). The control signal SWe and the control signal SWb are now brought both to a low value, so that both the transistor 320 and the transistor 245 are turned off to define corresponding open circuits.

In this condition, the measuring current Im flows through the transistor 220m. The measuring current Im and the internal current I sum up at the drain terminal of the transistor 305m into a (sum) current Im+Ir, which flows through it. This current Im+Ir is mirrored on the transistor 305r. The reference current Ir is subtracted from the (mirrored) current Im+Ir at the source terminal of the transistor 310r. Therefore, a (difference) current equal to Im+Io−Ir flows through the transistors 310r and 315r. The transistor 315r (biased to conduct the internal current Io) is then forced to conduct a current in excess or in defect of a value Im+Io−Ir−Io=Im−Ir. Therefore, when the measuring current Im is higher than the reference current Ir, the voltage across the transistor 315r decreases due to the current Im−Ir in excess (and therefore the output voltage Vout takes the low value). On the contrary, when the measuring current Im is lower than the reference current Ir, the voltage across the transistor 315r increases due to the current Im−Ir in defect (and therefore the output voltage Vout takes the high value).

The structure described above (with the additional branches 310m, 315m and 310m, 315r) substantially increases (for example, it doubles) the current capacity of the sense amplifier 205. This allows reducing the length of the sense operation significantly (for example, down to 10-15 ns), and therefore the power consumption of the entire non-volatile memory device. This advantage is particularly evident in case the non-volatile memory device is embedded in a portable system being supplied by battery (for example, in smart-phones or tablets).

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise), and the term means for (or any means-plus-function formulation) should be intended as any entity or structure suitable for carrying out the relevant function.

For example, an embodiment provides a sense structure comprising a plurality of sense amplifiers. Each sense amplifier comprises at least one measuring terminal and a reference terminal for receiving a measuring current and a reference current, respectively. Each sense amplifier comprises output means or circuitry for providing an output voltage according to a comparison between the measuring current and the reference current. Each sense amplifier comprises voltage regulating means or circuitry in cascode configuration for regulating a voltage at the measuring terminal and at the reference terminal. The regulating means or circuitry includes a measuring regulating transistor and a reference regulating transistor, which have a first conduction terminal coupled with the measuring terminal and with the reference terminal, respectively, a second conduction terminal coupled with the output means and a control terminal coupled with a biasing terminal. The sense structure further comprises biasing means or circuitry for providing a biasing voltage to the biasing terminal of all the sense amplifiers. The sense structure comprises common regulating means or circuitry for regulating the biasing voltage for all the sense amplifiers. Each sense amplifier further comprises local regulating means or circuitry for regulating the biasing voltage applied to the biasing terminal. The sense structure further comprises switching means or circuitry, which may be selectively controlled for coupling the local regulating means of each sense amplifier with the common regulating means to refresh the local regulating means in a rest condition, and for decoupling the local regulating means of each sense amplifier from the common regulating means in an operative condition.

However, the sense structure may comprise any number (two or more) of sense amplifiers of any type (see below). Each sense amplifier may receive a measuring current (or more) and a reference current of any value and it may provide an output voltage of any value (for example, high or low when the measuring current is higher than the reference current and vice-versa). The voltage regulating means may be implemented in any way (for example, with additional or different types of transistors such as NMOS, PMOS, BJT NPN or BJT PNP, and therefore with different conduction terminals, such as source/drain or emitter/collector and different control terminals, such as gate/base). The biasing means or circuitry may be implemented in any way and it may provide a biasing voltage of any value (even not generated internally). The local and common regulating means or circuitry may be implemented in any way (see below). The switching means or circuitry may be implemented in any way (for example, by MOS or BJT transistors), and it may be controlled in any way (for example, to refresh the local regulating means or circuitry only during part of the rest condition, such as periodically).

In an embodiment, the common regulating means or circuitry comprises a common capacitor coupled between an output terminal of the biasing means suitable to provide the biasing voltage and a ground terminal for receiving a ground voltage. In each sense amplifier, the local regulating means or circuitry comprises a local capacitor coupled between the biasing terminal and the ground terminal.

However, the common capacitor and the local capacitors may have any capacitance. In any case, the common regulating means or circuitry and the local regulating means or circuitry may be implemented in any way (for example, with more capacitors in parallel).

In an embodiment, the switching means or circuitry may include a switch for each sense amplifier. The switch is coupled between the output terminal of the biasing means and the biasing terminal.

However, the switch may be implemented in any way (for example, with one or more MOS or BJT transistors). In any case, a different implementation of the switching means is not excluded (for example, with a single switch for all the sense amplifiers).

In an embodiment, each sense amplifier comprises means or circuitry for providing an internal current, means or circuitry for summing the measuring current and the internal current to define a sum current, means or circuitry for mirroring the sum current, means or circuitry for subtracting the reference current from the mirrored sum current to define a difference current, and means or circuitry for providing the output voltage according to a comparison between the difference current and the internal current.

However, the above-mentioned means may be implemented in any way (see below). In any case, the sense amplifier may have any structure (for example, with a simple unbalanced current mirror).

In an embodiment, the output stage has a measuring node and a reference node coupled with the second conduction terminal of the measuring regulating transistor and of the reference regulating transistor, respectively. The output stage comprises a first internal measuring transistor and a first internal reference transistor, which have a first conduction terminal coupled with the measuring node and with the reference node, respectively, and a control terminal coupled with a first internal biasing terminal for receiving a first internal biasing voltage adapted to bias the first internal measuring transistor and the first internal reference transistor to conduct the internal current. The output stage comprises a second internal measuring transistor and a second internal reference transistor, which have a first conduction terminal coupled with a ground terminal, a second conduction terminal coupled with a second conduction terminal of the first internal measuring transistor and of the first internal reference transistor, respectively, and a control terminal coupled with a second internal biasing terminal for receiving a second internal biasing voltage adapted to bias the second internal measuring transistor and the second internal reference transistor to conduct the internal current. The output stage comprises a measuring conversion transistor and a reference conversion transistor, which have a first conduction terminal coupled with a power supply terminal for receiving a supply voltage, a second conduction terminal coupled with the measuring node and with the reference node, respectively, and a control terminal coupled with the second conduction terminal of the first internal measuring transistor.

However, the output stage may be implemented in any way (for example, with BJT or MOS transistors, either of different type or all of the same type).

A further embodiment provides a non-volatile memory device. The non-volatile memory device comprises a plurality of memory cells and the above-mentioned sense structure (for receiving the measuring currents from a plurality of selected memory cells and for providing the output voltages representing a logic value stored in the corresponding selected memory cells).

However, the non-volatile memory device may be of any type (for example, flash, EEPROM). The memory cells may be of any type (for example, PCM) and in any number. The memory cells may have any organization (for example, one or more matrices with NOR or NAND architecture). The memory cells may be read at the level of any word, and their logic values may be represented in any way (for example, even with more than one bit per each multi-level memory cell). In any case, the sense structure may also be used in memory devices of another type (for example, DRAM), or more generally in any other application (for example, sensors).

A further embodiment provides a system comprising at least one non-volatile memory device mentioned above. However, the system may comprise any number of non-volatile memory devices. Furthermore, the system may be of any type (for example, a smart card) and made in any form (for example, on multiple distinct chips). In any case, the non-volatile memory device may also be made and put on the market as a stand-alone product.

Generally, the above-described structure may be part of the design of an integrated circuit. The design may also be created in a hardware description language. Moreover, if the designer does not manufacture chips or masks, the design may be transmitted by physical means to others. In any case, the resulting integrated circuit may be distributed by its supplier in raw wafer form, as a bare die, or in packages.

Similar considerations apply if the sense structure, the non-volatile memory device and the system each has a different structure or comprises equivalent components (for example, of different materials), or it has other operative characteristics. In any case, every component thereof may be separated into more elements, or two or more components may be combined together into a single element. Moreover, each component may be replicated to support the execution of the corresponding operations in parallel. Moreover, unless specified otherwise, any interaction between different components generally does not need to be continuous, and it may be either direct or indirect through one or more intermediaries.

A further embodiment provides a sensing method comprising the following steps. At least one measuring current and a reference current are received at a measuring terminal and at a reference terminal, respectively, of each one of a plurality of sense amplifiers of a sense structure. A biasing voltage is regulated for all the sense amplifiers by common regulating means. The biasing voltage is provided to the biasing terminal of all the sense amplifiers. A voltage at the measuring terminal and at the reference terminal of each sense amplifier is regulated by voltage regulating means in cascode configuration, which comprises a measuring regulating transistor and a reference regulating transistor having a first conduction terminal coupled with the measuring terminal and with the reference terminal, respectively, a second conduction terminal coupled with output means or circuitry of the sense amplifier and a control terminal coupled with a biasing terminal. An output voltage is provided according to a comparison between the measuring current and the reference current by output means of each sense amplifier. The biasing voltage is further regulated at the biasing terminal of each sense amplifier by local regulating means. Switching means or circuitry are controlled selectively for coupling the local regulating means or circuitry of each sense amplifier with the common regulating means or circuitry to refresh the local regulating means in a rest condition and for decoupling the local regulating means of each sense amplifier from the common regulating means in an operative condition.

Generally, similar considerations apply if the same solution is implemented with an equivalent method (by using similar steps with the same functions of more steps or portions thereof, removing some steps being non-essential, or adding further optional steps). Moreover, the steps may be performed in a different order, concurrently or in an interleaved way (at least in part).

The invention claimed is:

1. A sense structure comprising:
a plurality of sense amplifiers, each comprising
at least one measuring terminal and a reference terminal configured to receive a measuring current and a reference current, respectively,
output circuitry configured to provide an output voltage based upon a comparison between the measuring current and the reference current,
a biasing terminal, and
voltage regulating circuitry in a cascode configuration and configured to regulate a voltage at the measuring terminal and at the reference terminal, the voltage regulating circuitry comprising a measuring regulating transistor and a reference regulating transistor having first conduction terminals coupled to the measuring and reference terminals, respectively, second conduction terminals coupled to the output circuitry, and control terminals coupled to the biasing terminal;
biasing circuitry configured to provide a biasing voltage to the biasing terminal of the plurality of sense amplifiers;
common regulating circuitry configured to regulate the biasing voltage for the plurality of sense amplifiers and comprising a voltage reference terminal configured to receive a reference voltage;
each sense amplifier further comprising local regulating circuitry configured to regulate the biasing voltage applied to the biasing terminal, the local regulating circuitry comprising a local capacitor and a resistor coupled in series, the local capacitor coupled to the biasing terminal and the resistor coupled to the voltage reference terminal;

a first transistor selectively controllable and configured to couple the local regulating circuitry of each of the plurality of sense amplifiers to the common regulating circuitry to refresh the local regulating circuitry in a rest condition and to decouple the local regulating circuitry of each of the plurality of sense amplifiers from the common regulating circuitry in an operative condition; and each sense amplifier comprising a second transistor having first and second conduction terminals coupled to the reference terminal and the measuring terminal, respectively, and a gate terminal coupled to control circuitry, said second transistor configured to selectively couple the reference terminal to the measuring terminal during a pre-charging phase of the measuring terminal based upon a control signal received at the gate terminal from the control circuitry.

2. The sense structure according to claim 1, wherein the biasing circuitry comprises an output terminal; and wherein the common regulating circuitry comprises a common capacitor coupled between the output terminal and configured to provide the biasing voltage.

3. The sense structure according to claim 2, wherein said first transistor is coupled between the output terminal of the biasing circuitry and the biasing terminal.

4. The sense structure according to claim 1, wherein each sense amplifier comprises current providing circuitry configured to provide an internal current, summing circuitry configured to sum the measuring current and the internal current to define a sum current, mirroring circuitry configured to mirror the sum current, subtraction circuitry configured to subtract subtracting the reference current from the mirrored sum current to define a difference current, and output circuitry configured to provide an output voltage based upon a comparison between the difference current and the internal current.

5. The sense structure according to claim 4, wherein the output circuitry has a measuring node and a reference node coupled to the second conduction terminal of the measuring regulating transistor and of the reference regulating transistor, respectively, and wherein the output circuitry comprises:

a first internal measuring transistor and a first internal reference transistor having a first conduction terminal coupled to the measuring node and to the reference node, respectively, and a control terminal coupled to a first internal biasing terminal for receiving a first internal biasing voltage configured to bias the first internal measuring transistor and the first internal reference transistor to conduct the internal current;

a second internal measuring transistor and a second internal reference transistor having a first conduction terminal coupled to the voltage reference terminal, a second conduction terminal coupled to a second conduction terminal of the first internal measuring transistor and of the first internal reference transistor, respectively, and a control terminal coupled to a second internal biasing terminal for receiving a second internal biasing voltage configured to bias the second internal measuring transistor and the second internal reference transistor to conduct the internal current; and a measuring conversion transistor and a reference conversion transistor having a first conduction terminal coupled to a power supply terminal for receiving a supply voltage, a second conduction terminal coupled to the measuring node and to the reference node, respectively, and a control terminal coupled to the second conduction terminal of the first internal measuring transistor.

6. A non-volatile memory device comprising:
a plurality of memory cells; and
a sense structure coupled to the plurality of memory comprising
a plurality of sense amplifiers, each comprising
at least one measuring terminal and a reference terminal configured to receive a measuring current and a reference current, respectively,
output circuitry configured to provide an output voltage based upon a comparison between the measuring current and the reference current,
a biasing terminal, and
voltage regulating circuitry configured to regulate a voltage at the measuring terminal and at the reference terminal, the voltage regulating circuitry comprising a measuring regulating transistor and a reference regulating transistor having first conduction terminals coupled to the measuring and reference terminals, respectively, second conduction terminals coupled to the output circuitry, and control terminals coupled to the biasing terminal,
biasing circuitry configured to provide a biasing voltage to the biasing terminal of the plurality of sense amplifiers,
common regulating circuitry configured to regulate the biasing voltage for the plurality of sense amplifiers and comprising a voltage reference terminal configured to receive a reference voltage,
each sense amplifier further comprising local regulating circuitry configured to regulate the biasing voltage applied to the biasing terminal, the local regulating circuitry comprising a local capacitor and a resistor coupled in series, the local capacitor coupled to the biasing terminal and the resistor coupled to the voltage reference terminal,
a first transistor selectively controllable and configured to couple the local regulating circuitry of each of the plurality of sense amplifiers to the common regulating circuitry to refresh the local regulating circuitry in a rest condition and to decouple the local regulating circuitry of each of the plurality of sense amplifiers from the common regulating circuitry in an operative condition, and
each sense amplifier comprising a second transistor having first and second conduction terminals coupled to the reference terminal and the measuring terminal, respectively, and a gate terminal coupled to control circuitry, said second transistor configured to selectively couple the reference terminal to the measuring terminal during a pre-charging phase of the measuring terminal based upon a control signal received at the gate terminal from the control circuitry.

7. The non-volatile memory device according to claim 6, wherein the biasing circuitry comprises an output terminal; and wherein the common regulating circuitry comprises a common capacitor coupled between the output terminal and configured to provide the biasing voltage.

8. The non-volatile memory device according to claim 7, wherein said first transistor is coupled between the output terminal of the biasing circuitry and the biasing terminal.

9. The non-volatile memory device according to claim 6, wherein each sense amplifier comprises current providing circuitry configured to provide an internal current, summing circuitry configured to sum the measuring current and the internal current to define a sum current, mirroring circuitry configured to mirror the sum current, subtraction circuitry configured to subtract subtracting the reference current from the mirrored sum current to define a difference current, and output circuitry configured to provide an output voltage based upon a comparison between the difference current and the internal current.

10. The non-volatile memory device according to claim 9, wherein the output circuitry has a measuring node and a reference node coupled to the second conduction terminal of the measuring regulating transistor and of the reference regulating transistor, respectively, and wherein the output circuitry comprises:
  a first internal measuring transistor and a first internal reference transistor having a first conduction terminal coupled to the measuring node and to the reference node, respectively, and a control terminal coupled to a first internal biasing terminal for receiving a first internal biasing voltage configured to bias the first internal measuring transistor and the first internal reference transistor to conduct the internal current;
  a second internal measuring transistor and a second internal reference transistor having a first conduction terminal coupled to the voltage reference terminal, a second conduction terminal coupled to a second conduction terminal of the first internal measuring transistor and of the first internal reference transistor, respectively, and a control terminal coupled to a second internal biasing terminal for receiving a second internal biasing voltage configured to bias the second internal measuring transistor and the second internal reference transistor to conduct the internal current; and
  a measuring conversion transistor and a reference conversion transistor having a first conduction terminal coupled to a power supply terminal for receiving a supply voltage, a second conduction terminal coupled to the measuring node and to the reference node, respectively, and a control terminal coupled to the second conduction terminal of the first internal measuring transistor.

11. A sensing method comprising:
  receiving at least one measuring current and a reference current at a measuring terminal and at a reference terminal, respectively, of each one of a plurality of sense amplifiers;
  regulating a biasing voltage for the plurality of sense amplifiers using common regulating circuitry comprising a voltage reference terminal configured to receive a reference voltage;
  providing the biasing voltage to a biasing terminal of the plurality of sense amplifiers;
  regulating a voltage at the measuring and reference terminals of each of the plurality of sense amplifiers by voltage regulating circuitry comprising a measuring regulating transistor and a reference regulating transistor having first conduction terminals coupled to the measuring terminal and to the reference terminal, respectively, second conduction terminals coupled to output circuitry of a sense amplifier, and control terminals coupled to the biasing terminal;
  providing an output voltage based upon a comparison between the measuring current and the reference current by the output circuitry of each of the plurality of sense amplifiers;
  further regulating the biasing voltage at the biasing terminal of each of the plurality of sense amplifiers by local regulating circuitry comprising a local capacitor and a resistor coupled in series, the local capacitor being coupled to the biasing terminal and the resistor coupled to the voltage reference terminal;
  selectively controlling a first transistor to couple the local regulating circuitry of each of the plurality of sense amplifiers to the common regulating circuitry to refresh the local regulating circuitry in a rest condition and to decouple the local regulating circuitry of each of the plurality of sense amplifiers from the common regulating circuitry in an operative condition; and
  selectively coupling the reference terminal to the measuring terminal, via first and second conduction terminals of a second transistor, during a pre-charging phase of the measuring terminal based upon a control signal received at a gate terminal of the second transistor, the control signal being received from control circuitry.

12. The method according to claim 11, wherein the biasing circuitry comprises an output terminal; and wherein the common regulating circuitry comprises a common capacitor coupled between the output terminal and configured to provide the biasing voltage.

13. The method according to claim 12, wherein the second transistor is coupled between the output terminal of the biasing circuitry and the biasing terminal.

* * * * *